(12) United States Patent
Frese (10) Patent No.: US 10,330,496 B2
(45) Date of Patent: Jun. 25, 2019

(54) SENSOR ARRANGEMENT FOR DETECTING ROTATIONAL ANGLES ON A ROTATING COMPONENT IN A VEHICLE

(71) Applicant: Robert Bosch GmbH, Stuttgart (DE)

(72) Inventor: Volker Frese, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/039,055

(22) PCT Filed: Sep. 22, 2014

(86) PCT No.: PCT/EP2014/070137
§ 371 (c)(1),
(2) Date: May 25, 2016

(87) PCT Pub. No.: WO2015/078606
PCT Pub. Date: Jun. 4, 2015

(65) Prior Publication Data
US 2017/0160101 A1 Jun. 8, 2017

(30) Foreign Application Priority Data
Nov. 26, 2013 (DE) .................. 10 2013 224 098

(51) Int. Cl.
*G01B 7/30* (2006.01)
*G01D 5/20* (2006.01)
(Continued)

(52) U.S. Cl.
CPC ............. *G01D 5/145* (2013.01); *G01B 7/30* (2013.01); *G01B 21/22* (2013.01); *G01D 5/147* (2013.01);
(Continued)

(58) Field of Classification Search
CPC ...... G01D 5/145; G01D 5/2066; G01D 5/147; H03K 17/95; G01B 21/22; G01B 7/30
See application file for complete search history.

(56) References Cited

U.S. PATENT DOCUMENTS 5,481,188 A * 1/1996 Mizutani ................ G01D 5/145
324/207.21
6,791,219 B1 * 9/2004 Eric ...................... H02K 11/215
310/68 B
(Continued)

FOREIGN PATENT DOCUMENTS

DE  10 2008 011 448 A1  9/2009
EP     2 078 930 A1  7/2009
(Continued)

OTHER PUBLICATIONS

International Search Report corresponding to PCT Application No. PCT/EP2014/070137, dated Nov. 27, 2014 (German and English language document) (5 pages).

*Primary Examiner* — Son T Le
*Assistant Examiner* — Akm Zakaria
(74) *Attorney, Agent, or Firm* — Maginot, Moore & Beck LLP (57) ABSTRACT

A sensor arrangement is configured to detect rotational angles on a rotating component in a vehicle. The rotating component is coupled to at least one measurement transmitter which generates at least one piece of angle information in connection with at least one measurement sensor in order to determine the rotational angle of the rotating component. A first measurement transmitter and a first measurement sensor form a first angle sensor which generates first angle information that is dependent on the rotational movement of the rotating component, and a second measurement transmitter and a second measurement sensor form a second angle sensor which generates second angle
(Continued)

information that is dependent on the rotational movement of the rotating component. A current rotational angle of the rotating component is ascertained from the first angle information and the second angle information. The first angle sensor and the second angle sensor are designed as inductive sensors.

16 Claims, 3 Drawing Sheets

(51) Int. Cl.
*G01B 21/22* (2006.01)
*H03K 17/95* (2006.01)
*G01D 5/14* (2006.01)

(52) U.S. Cl.
CPC .............. *G01D 5/20* (2013.01); *G01D 5/2066* (2013.01); *H03K 17/95* (2013.01)

(56) References Cited

U.S. PATENT DOCUMENTS

| | | | | |
|---|---|---|---|---|
| 2009/0146650 A1* | 6/2009 | Hatanaka | ................ | G01D 5/04 324/207.25 |
| 2009/0219016 A1* | 9/2009 | Debrailly | ............... | G01D 5/145 324/207.25 |
| 2010/0050731 A1* | 3/2010 | Granig | ................... | G01D 5/145 73/1.11 |
| 2013/0099778 A1* | 4/2013 | Aikawa | ................ | G01R 33/028 324/207.17 |

FOREIGN PATENT DOCUMENTS

| | | | | |
|---|---|---|---|---|
| EP | 2078930 A1 * | 7/2009 | ............... | G01B 7/30 |
| EP | 2 180 296 A1 | 4/2010 | | |

\* cited by examiner

SENSOR ARRANGEMENT FOR DETECTING ROTATIONAL ANGLES ON A ROTATING COMPONENT IN A VEHICLE

This application is a 35 U.S.C. § 371 National Stage Application of PCT/EP2014/070137, filed on Sep. 22, 2014, which claims the benefit of priority to Serial No. DE 10 2013 224 098.8, filed on Nov. 26, 2013 in Germany, the disclosures of which are incorporated herein by reference in their entirety.

BACKGROUND

The present disclosure relates to a sensor arrangement for detecting rotational angles on a rotating component in a vehicle.

Steering angle sensors are intended to measure up to six revolutions of a steering wheel, which corresponds to an angle range of about 2000°. Therefore, a count of revolution periodicity sections must be ensured in addition to the angle measurement. Steering angle sensors which measure the steering angle for a plurality of revolutions of the steering wheel with the aid of two gear wheels, which are coupled to a steering column by means of a large gear wheel, are known from the prior art. Permanent magnets are arranged in the middle of the gear wheels, and the angle of the gear wheels can be determined with the aid of magnetic field sensors. The two gear wheels have a slightly different number of teeth, so that the respective revolution of the gear wheels can also be determined from the ratio of the angles to one another. The angle of the steering wheel can therefore be determined over a plurality of revolutions. For this known embodiment, two gear wheels, and therefore also two magnetic field sensors, are required for determining the current rotational angle.

For example, the laid-open specification DE 10 2008 011 448 A1 describes an arrangement for detecting a rotational angle. The described arrangement comprises transducers and sensors, which detect changes of a physical quantity generated by the transducers as a function of a rotational angle change of a rotating component as digitally evaluable signals. The rotating component has, coupled to its circumference, at least one smaller-circumference satellite revolving because of its rotation, preferably with an angle sensor which drives, by means of an axially coupled hypocycloid drive, a likewise rotating hypercycloid disk or hypocycloid gear wheel, the rotational speed of which is reduced by the hypocycloid drive in such a way that a number of revolutions of the rotating component and the absolute steering angle over a plurality of revolutions of the steering shaft can be determined therefrom by a rotation sensor system.

SUMMARY

The sensor arrangement according to the disclosure for detecting rotational angles on a rotating component in a vehicle, has the advantage thereover that the rotational angle on a rotating component can be determined simply and reliably over a plurality of revolutions with a high accuracy. Embodiments of the present disclosure may therefore preferably be used to determine a steering angle of a steering wheel in a motor vehicle.

Embodiments of the present disclosure provide a sensor arrangement for detecting rotational angles on a rotating component in a vehicle. In this case, the rotating component is coupled to at least one measuring transducer which, in conjunction with at least one measuring pickup, generates at least one angle information item for determination of the rotational angle of the rotating component. A first measuring transducer and a first measuring pickup form a first angle sensor that generates a first angle information item dependent on the rotational movement of the rotating component. A second measuring transducer and a second measuring pickup form a second angle sensor that generates a second angle information item dependent on the rotational movement of the rotating component. A current rotational angle of the rotating component can be determined from the first angle information item and the second angle information item. According to the disclosure, the first angle sensor and the second angle sensor are configured as inductive sensors, the measuring transducers respectively having at least one detection range and the measuring pickups respectively having at least one detection coil. The at least one detection range of the respective measuring transducer influences the inductance of the at least one corresponding detection coil of the measuring pickup so that the inductance of the at least one detection coil changes periodically because of the rotational movement of the rotating component and can be evaluated as a measure of the rotational angle of the rotating component.

The inductive sensors are preferably configured as eddy current sensors. In general, the inductance of a conductive track geometry can be measured with eddy current sensors. Usually, a metallic conductor which prevents penetration of the electric field and thus changes the inductance of the conductive track geometry, is moved in the vicinity of the conductive track geometry. If a tuned circuit is then formed with the conductive track geometry, then the resonant frequency of the latter is dependent on the inductance of the conductive track geometry and therefore the location of the metallic conductor in the vicinity of the conductive track geometry. The position of the metallic conductor can therefore be determined by evaluating the inductance of the conductive track geometry.

In embodiments of the present disclosure, the inductance of the detection coils in the measuring pickup is dependent on the covering or overlap with the corresponding detection range of the measuring transducer. The inductance of the respective detection coil can be determined by a frequency measurement of a tuned circuit with the detection coil or with a direct inductance measurement using the imaginary component of the impedance of the tuned circuit at a fixed frequency, or by mixing with a reference frequency. The signal is then calculated back to the overlap angle of the detection coil with the detection ranges.

Advantageous improvements of the sensor arrangement for detecting rotational angles on a rotating component in a vehicle, are possible through the measures and refinements disclosed herein.

It is particularly advantageous that the measuring transducers can respectively be configured as an annular disk, these being driven by the rotating component. The at least one detection range may be arranged in the form of an annular segment on the outer edge region of the annular disk and consist either essentially of an electrically conductive material or essentially of a ferromagnetic material. Both the predominantly electrically conductive material and the predominantly ferromagnetic material influence the inductance of the detection coils and make it possible to determine the desired angle information. In this case, a predominantly electrically conductive material reduces the inductance of the detection coils by the eddy current effect. A predominantly ferromagnetic material would increase the inductance of the detection coils.

In one advantageous configuration of the sensor arrangement according to the disclosure, the first measuring transducer may have four detection ranges and, on the outer circumference, a first annular gear with a first number of teeth, and be fitted onto the rotating component and connected thereto in a rotationally fixed manner. Furthermore, the second measuring transducer may have two detection ranges and, on the outer circumference, a second annular gear which has a second number of teeth and meshes with the first annular gear of the first measuring transducer, the first number of teeth and the second number of teeth having a predetermined tooth ratio. This also has the advantage that the annular disk around the rotating component can also be used as a measuring transducer. It is thus possible to omit one gear wheel when implementing the known Vernier principle. Compared with an embodiment having three gear wheels, this geometrical embodiment also has the advantage that the hysteresis of the measurement can be reduced significantly. Currently, when using three gear wheels, there is an average hysteresis of from 1 to 2°. This is because a gear wheel play occurs owing to temperature effects and measurement tolerances. During direction changes, this leads to the hysteresis which, in the event of unfavorable conditions in relation to temperature and tolerance, may then be up to 3°. If the large gear wheel is connected firmly to the rotating component, then the revolution or rotational angle of the rotating component can still be calculated according to the Vernier principle. Knowing the number of revolutions, it is now possible to calculate the rotational angle by means of the first measuring transducer, which is firmly connected to the rotating component. In this way, a much better hysteresis can be achieved since gear wheel play no longer occurs. Extremely small steering movements by the driver can therefore be detected. This may advantageously be used in order to detect certain "dead bands", i.e. missing steering movements, of fatigued drivers. On expressways, the actual steering angles are very small and, in the worst case, a large hysteresis of the steering angle can lead to false detection of missing steering movements, even though steering is actually being carried out. In the long term, the driver would then no longer take emitted warnings seriously.

In another advantageous configuration of the sensor arrangement according to the disclosure, the at least one detection coil of the first measuring pickup and the at least one detection coil of the second measuring pickup may be arranged in the form of annular segments on a common circuit carrier. In this way, it is advantageously possible to reduce layout area and therefore installation space.

In another advantageous configuration of the sensor arrangement according to the disclosure, the first measuring pickup may have, for example, three detection coils and generate the first angle information item with a first periodicity. The second measuring pickup may have three detection coils and generate the second angle information item with a second periodicity, in which case a periodicity ratio of the first periodicity to the second periodicity may be selected to be the inverse of the tooth ratio of the first number of teeth to the second number of teeth. The signals of the respectively three detection coils are to some extent redundant, so that the first or second angle information item can be determined from each signal curve. The information from the other two signal curves is additionally evaluated only in order to determine an increasing or decreasing curve branch. For each signal curve of the detection coils of the respective measuring pickup, therefore, the angle information item can be determined and the average value thereof can therefore be determined and used further. Possible tilts of the measuring transducers can therefore advantageously be compensated for and calculated out.

In another advantageous configuration of the sensor arrangement according to the disclosure, the detection coils of the measuring pickups may be arranged distributed in the circuit carrier in a plurality of layers. In this way, the effective inductance of the detection coils can advantageously be increased and the signal evaluation can therefore be simplified.

In another advantageous configuration of the sensor arrangement according to the disclosure, the circuit carrier and the measuring pickups may be arranged with respect to one another in such a way that the first measuring transducer at least partially covers the at least one detection coil of the first measuring pickup with its outer edge region and the second measuring transducer at least partially covers the at least one detection coil of the second measuring pickup with its outer edge region.

In another advantageous configuration of the sensor arrangement according to the disclosure, an evaluation and control unit may evaluate the detection coils of the measuring pickups simultaneously or in a predetermined sequence. Furthermore, the evaluation and control unit may use a reference coil arranged on the circuit carrier for differential measurements with the detection coils of the measuring pickups.

Exemplary embodiments of the disclosure are represented in the drawings and will be explained in more detail in the following description. In the drawings, references which are the same denote components or elements which fulfil the same or similar functions.

DETAILED DESCRIPTION

Figure 1:
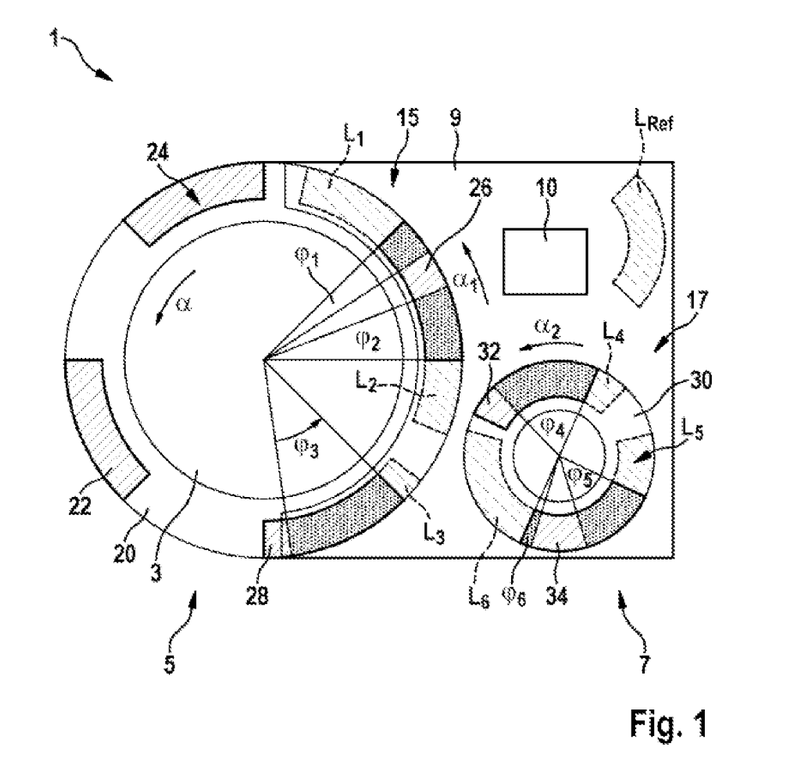
FIG. 1 shows a schematic representation of an exemplary embodiment of a sensor arrangement according to the disclosure.

As can be seen in FIG. 1, the exemplary embodiment represented of a sensor arrangement 1 according to the disclosure for detecting rotational angles on a rotating component 3 in a vehicle comprises at least one measuring transducer 20, 30, which is coupled to the rotating component 3 and, in conjunction with at least one measuring pickup 15, 17, generates at least one angle information item $\alpha_1$, $\alpha_2$ for determination of the rotational angle $\alpha$ of the rotating component 3. In this case, a first measuring transducer 20 and a first measuring pickup 15 form a first angle sensor 5 that generates a first angle information item $\alpha_1$ dependent on the rotational movement of the rotating component 3. A second measuring transducer 30 and a second measuring pickup 17 form a second angle sensor 7 that generates a second angle information item $\alpha_2$ dependent on the rotational movement of the rotating component 3. A current rotational angle $\alpha$ of the rotating component 3 can be determined from the first angle information item $\alpha_1$ and the second angle information item $\alpha_2$. According to the disclosure, the first angle sensor 5 and the second angle sensor 7 are configured as inductive sensors, the measuring transducers 20, 30 respectively having at least one detection range 22, 24, 26, 28, 32, 34 and the measuring pickups 15, 17 respectively having at least one detection coil $L_1$, $L_2$, $L_3$, $L_4$, $L_5$, $L_6$. The at least one detection range 22, 24, 26, 28, 32, 34 of the respective measuring transducer 20, 30 influences the inductance of the at least one corresponding detection coil $L_1$, $L_2$, $L_3$, $L_4$, $L_5$, $L_6$ of the measuring pickup 15, 17 so that the inductance of the at least one detection coil $L_1$, $L_2$, $L_3$, $L_4$, $L_5$, $L_6$ changes periodically because of the rotational movement of the rotating component 3 and can be evaluated as a measure of the rotational angle $\alpha$ of the rotating component 3.

Embodiments of the sensor arrangement 1 according to the disclosure may, for example, be used as a steering angle sensor for determining the steering angle of a vehicle or as a rotational angle sensor for determining a pedal position in the vehicle.

As can furthermore be seen in FIG. 1, the measuring transducers 20, 30 are respectively configured as an annular disk which is driven by the rotating component 3. The at least one detection range 22, 24, 26, 28, 32, 34 is arranged in the form of an annular segment on the outer edge region of the annular disk and consists essentially of an electrically conductive material in the exemplary embodiment represented. Thus, the detection ranges 22, 24, 26, 28, 32, 34 may, for example, be configured as metal inlays. As an alternative, the detection ranges 22, 24, 26, 28, 32, 34 may consist essentially of a ferromagnetic material.

In order to facilitate the driving of the measuring transducers 20, 30 configured as an annular disk and the transmission of the rotational movement of the rotating component 3 to the measuring transducers 20, 30, in the exemplary embodiment represented the measuring transducers 20, 30 are configured as gear wheels. Thus, in the exemplary embodiment represented, the first measuring transducer 20 has four detection ranges 22, 24, 26, 28 and, on the outer circumference, a first annular gear (not represented in more detail) which has a first number of teeth. The first measuring transducer 20 is fitted onto the rotating component 3 and is connected thereto in a rotationally fixed manner. In the embodiment as a steering angle sensor, the rotating component 3 represents a steering column of the vehicle. In the exemplary embodiment represented, the second measuring transducer 30 has two detection ranges 32, 34 and, on the outer circumference, a second annular gear which has a second number of teeth and meshes with the first annular gear of the first measuring transducer 20. In this case, the first measuring transducer 20 has a larger diameter than the second measuring transducer 30. The first annular gear therefore has more teeth than the second annular gear, the first number of teeth and the second number of teeth having a predetermined tooth ratio. In order to generate the measurement signals of the two measuring transducers 20, 30 with a similar periodicity, the larger first measuring transducer 20 has more detection ranges than the small second measuring transducer 30. This leads to a smaller periodicity angle of the larger first measuring transducer 20.

In the exemplary embodiment represented, the first annular gear has 69 teeth and the four detection ranges 22, 24, 26, 28 of the first measuring transducer 20, which are configured as annular segments, have a width of about 45° and are distributed uniformly on the outer edge. The small second annular gear has 33 teeth and the two detection ranges 32, 34 of the second measuring transducer 30, which are configured as annular segments, have a width of about 90° and are arranged opposite one another on the outer edge.

As can furthermore be seen from FIG. 1, the at least one detection coil $L_1$, $L_2$, $L_3$ of the first measuring pickup 15 and the at least one detection coil $L_4$, $L_5$, $L_6$ of the second measuring pickup 17 are arranged in the form of annular segments on a common circuit carrier 9. An evaluation and control unit 10 may evaluate the detection coils $L_1$, $L_2$, $L_3$, $L_4$, $L_5$, $L_6$ of the measuring pickups 15, 17 simultaneously or in a predetermined sequence. Furthermore, the evaluation and control unit 10 uses a reference coil $L_{Ref}$ arranged on the circuit carrier 9 for differential measurements with the detection coils $L_1$, $L_2$, $L_3$, $L_4$, $L_5$, $L_6$ of the measuring pickups 15, 17. The detection coils $L_1$, $L_2$, $L_3$, $L_4$, $L_5$, $L_6$ of the measuring pickups 15, 17 and the reference coil $L_{Ref}$ may be arranged distributed in the circuit carrier 9 in a plurality of layers, in order to increase the inductance and facilitate the evaluation. The electrical connections between the coils $L_1$, $L_2$, $L_3$, $L_4$, $L_5$, $L_6$, $L_{Ref}$ and the evaluation and control unit 10 have not been represented for the sake of clarity. In the exemplary embodiment represented, the first measuring pickup 15 has three detection coils $L_1$, $L_2$, $L_3$ and generates the first angle information item with a first periodicity. The second measuring pickup 17 likewise has three detection coils $L_4$, $L_5$, $L_6$ and generates the second angle information item with a second periodicity. The reference coil $L_{Ref}$ and the detection coils $L_1$, $L_2$, $L_3$, $L_4$, $L_5$, $L_6$ all have similar sizes. For the large first measuring transducer 20, the three detection coils $L_1$, $L_2$, $L_3$ of the first measuring pickup 15 respectively have a width of 45° and a spacing of 15° in the radius of the large first measuring transducer 20. For the small second measuring transducer 30, the three detection coils $L_1$, $L_2$, $L_3$ of the second measuring pickup 17 have a width of 90° and a spacing of 30° in the radius of the small second measuring transducer 30. In principle, the periodicity should be approximately the inverse of the tooth ratio, or the radius ratio. Here, the first measuring transducer 20 and the rotating component 3 have approximately two times the number of teeth and half the periodicity angle.

As can furthermore be seen in FIG. 1, the circuit carrier 9 and the measuring pickups are arranged with respect to one another in such a way that the first measuring transducer 20 at least partially covers the detection coils $L_1$, $L_2$, $L_3$ of the first measuring pickup 15 with its outer edge region and the second measuring transducer 30 at least partially covers the detection coils $L_4$, $L_5$, $L_6$ of the second measuring pickup 17 with its outer edge region. In the exemplary embodiment represented the circuit carrier 9 does not fully enclose the rotating component 3 but has a recess that encloses the rotating component 3 over an angle of about 180°. The first measuring pickup 15, arranged at the edge of the recess, therefore likewise covers the first measuring transducer 20 only over an angle of about 180°. The second measuring pickup 17, however, covers the second measuring transducer 30 fully, i.e. over an angle of 360°.

The inductance of the individual detection coils $L_1$, $L_2$, $L_3$, $L_4$, $L_5$, $L_6$ is dependent on the overlap angle $\varphi_1$, $\varphi_2$, $\varphi_3$, $\varphi_4$, $\varphi_5$, $\varphi_6$ of the respective detection coil $L_1$, $L_2$, $L_3$, $L_4$, $L_5$, $L_6$ with one of the detection ranges 22, 24, 26, 28, 32, 34 of the corresponding measuring transducer 20, 30. The inductance may be determined by the evaluation and control unit 10 by means of a frequency measurement of a tuned circuit which comprises the respective detection coil $L_1$, $L_2$, $L_3$, $L_4$, $L_5$, $L_6$, or by means of a direct inductance measurement using the imaginary component of the impedance of the tuned circuit at a fixed frequency, or by mixing with a reference frequency. The evaluation and control unit 10 then calculates the detected inductance signal back to the overlap angle $\varphi_1$, $\varphi_2$, $\varphi_3$, $\varphi_4$, $\varphi_5$, $\varphi_6$ of the respective detection coil $L_1$, $L_2$, $L_3$, $L_4$, $L_5$, $L_6$ with one of the detection ranges 22, 24, 26, 28, 32, 34.

Figure 2:
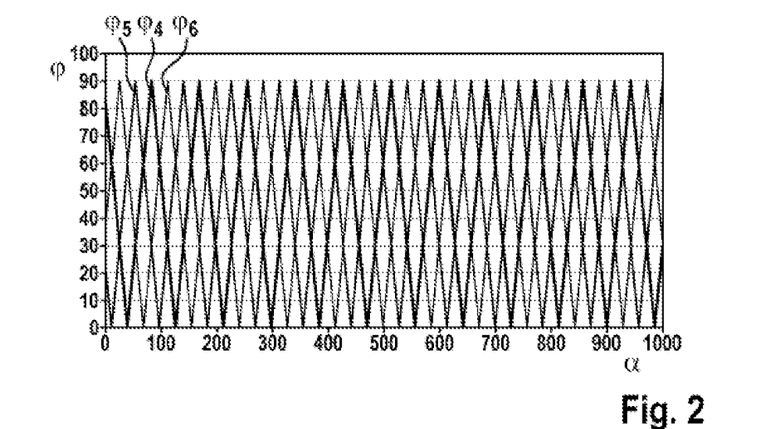
FIG. 2 shows a schematic characteristic curve diagram of overlap angles of three detection coils of a measuring pickup as a function of the rotational angle of a rotating component.
Figure 3:
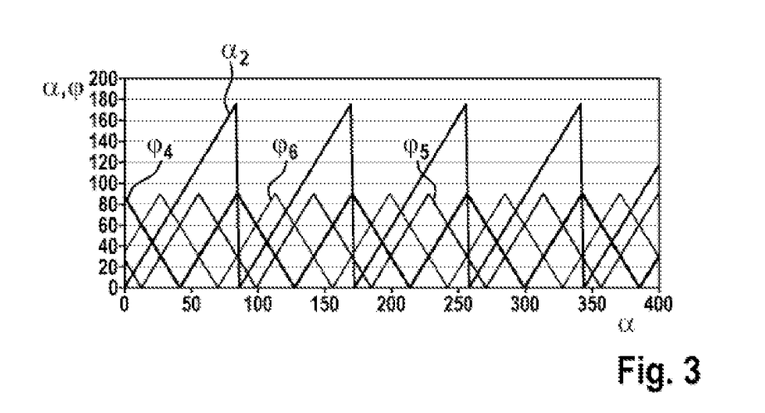
FIG. 3 shows a more detailed characteristic curve diagram of the overlap angle of the three detection coils of a measuring pickup as a function of the rotational angle of a rotating component of FIG. 2 and an angle information item generated therefrom.

FIGS. 2 and 3 respectively show the dependency of the overlap angles $\varphi_4$, $\varphi_5$, $\varphi_6$ of the three detection coils $L_4$, $L_5$, $L_6$ of the second measuring pickup 17 as a function of the rotational angle $\alpha$ of the rotating component 3. From the represented signal profiles of the three overlap angles $\varphi_4$, $\varphi_5$, $\varphi_6$, the evaluation and control unit 10 can then determine the second angle information item $\alpha_2$ of the small second measuring transducer 30 to within the periodicity of 180°. The signal profiles of the three overlap angles $\varphi_4$, $\varphi_5$, $\varphi_6$ are to some extent redundant. From each of the signal profiles, the evaluation and control unit 10 can determine the second angle information item $\alpha_2$, the evaluation and control unit 10 only evaluating the information items from the other two signal profiles additionally in order to determine whether the branch is an increasing branch or a decreasing branch of the signal profile is present. The second angle information item $\alpha_2$ can therefore be determined for each signal profile of the overlap angles $\varphi_1$, $\varphi_5$, $\varphi_6$, the evaluation and control unit 10 preferably calculating an average value and using the calculated average value as the second angle information item $\alpha_2$ for further evaluations and calculations. Possible tilts of the measuring transducers 20, 30 can therefore be compensated for and calculated out.

Figure 4:
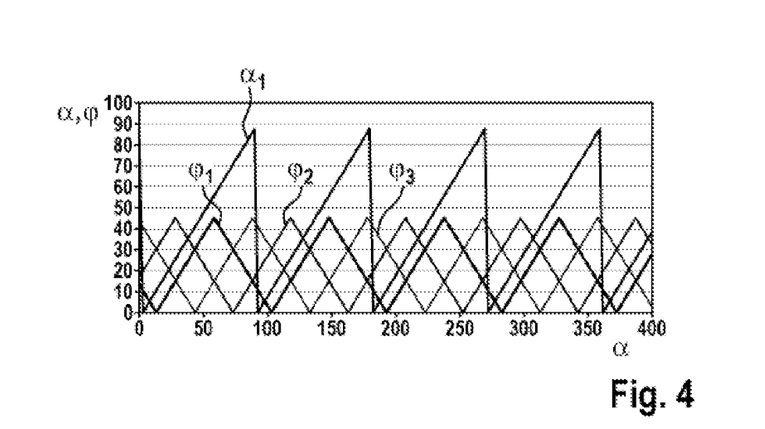
FIG. 4 shows a more detailed characteristic curve diagram of the overlap angle of three detection coils of another measuring pickup as a function of the rotational angle of a rotating component and another angle information item generated therefrom.

FIG. 4 shows the dependency of the overlap angles $\varphi_1$, $\varphi_2$, $\varphi_3$ of the three detection coils $L_1$, $L_2$, $L_3$ of the first measuring pickup 15 as a function of the rotational angle $\alpha$ of the rotating component 3. In a similar way to the calculation of the second angle information item $\alpha_2$, the evaluation and control unit 10 can determine the first angle information item $\alpha_1$ of the large first measuring transducer 20 to within the periodicity of 90° from the represented signal profiles of the three overlap angles $\varphi_1$, $\varphi_2$, $\varphi_3$.

Figure 5:
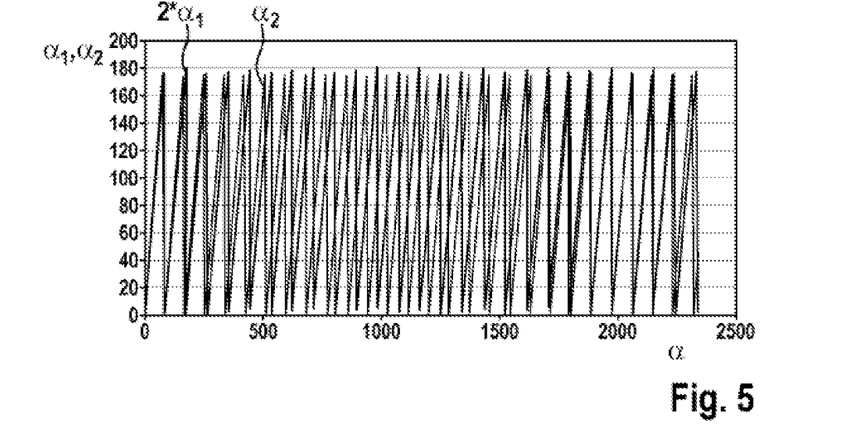
FIG. 5 shows a schematic characteristic curve diagram of the angle information items of FIGS. 3 and 4 as a function of the rotational angle of a rotating component.

FIG. 5 shows the two angle information items $\alpha_1$, $\alpha_2$ of FIGS. 3 and 4, from which the revolution of the rotating component 3 is determined, as a function of the rotational angle $\alpha$ of the rotating component. If the first angle information item $\alpha_1$ of the large first measuring transducer 20 is multiplied by 2, it can now be seen that the two angle information items $\alpha_1$, $\alpha_2$ only repeat after 2000°, about 6 revolutions. The current rotational angle $\alpha$ of the rotating component 3 can therefore be determined with a high accuracy.

Embodiments of the sensor arrangement 1 according to the disclosure for detecting rotational angles $\alpha$ on a rotating component 3 in a vehicle have the advantage that the circuit carrier 9 does not fully enclose the rotating component 3, and the layout area can therefore be reduced. In order to be able to minimise the area under the small second measuring transducer 30, and therefore also keep the circuit carrier 9 as small as possible, the division ratio between the large first measuring transducer 20 and the small second measuring transducer 30 may be increased from 2 to 3.

The invention claimed is:

1. A sensor arrangement for detecting rotational angles on a rotating component in a vehicle, comprising:
    a common circuit carrier;
    a first angle sensor configured as an eddy current sensor including (i) a first measuring transducer coupled to the rotating component and having at least one detection range consisting of an electrically conductive material and (ii) a first measuring pickup arranged on the common circuit carrier and having at least two detection coils, an inductance of the at least two detection coils of the first measuring pickup being influenced by a position of the at least one detection range of the first measuring transducer such that the inductance of the at least one detection coils of the first measuring pickup changes periodically in response to rotational movement of the rotating component and is evaluable as a measure of a rotational angle of the rotating component, the first angle sensor configured to generate a first angle information item that is dependent on rotational movement of the rotating component; and
    a second angle sensor configured as an eddy current sensor including (i) a second measuring transducer coupled to the rotating component and having at least one detection range consisting of an electrically conductive material and (ii) a second measuring pickup arranged on the common circuit carrier and having at least two detection coils, an inductance of the at least two detection coils of the second measuring pickup being influenced by a position of the at least one detection range of the second measuring transducer such that the inductance of the at least two detection coils of the second measuring pickup changes periodically in response to rotational movement of the rotating component and is evaluable as a measure of the rotational angle of the rotating component, the second angle sensor configured to generate a second angle information item that is dependent on the rotational movement of the rotating component,
    wherein the at least two detection coils of the first measuring pickup are distributed in the common circuit carrier in a plurality of layers and the at least two detection coils of the second measuring pickup are distributed in the common circuit carrier in a plurality of layers,
    wherein a current rotational angle of the rotating component is determinable from the first angle information item and the second angle information item,
    wherein the first measuring transducer and the second measuring transducer are respectively configured as an annular disk driven by the rotating component, and
    wherein the at least one detection range of the first measuring transducer and the at least one detection range of the second measuring transducer are arranged as an annular segment on an outer edge region of the respective annular disk and include the electrically conductive material.

2. The sensor arrangement as claimed in claim 1, wherein the first measuring transducer has four detection ranges and, on an outer circumference, a first annular gear with a first number of teeth, and is fitted onto the rotating component and connected thereto in a rotationally fixed manner.

3. The sensor arrangement as claimed in claim 2, wherein:
    the second measuring transducer has two detection ranges and, on an outer circumference, a second annular gear which has a second number of teeth and meshes with the first annular gear of the first measuring transducer, and
    the first number of teeth and the second number of teeth have a predetermined tooth ratio.

4. The sensor arrangement as claimed in claim 1, wherein the at least two detection coils of the first measuring pickup and the at least two detection coils of the second measuring pickup are arranged in the form of annular segments in the common circuit carrier.

5. The sensor arrangement as claimed in claim 3, wherein:
the first measuring pickup has three detection coils and generates the first angle information item with a first periodicity,
the second measuring pickup has three detection coils and generates the second angle information item with a second periodicity,
a periodicity ratio of the first periodicity to the second periodicity is the inverse of the tooth ratio of the first number of teeth to the second number of teeth.

6. The sensor arrangement as claimed in claim 1, wherein the common circuit carrier, the first measuring pickup, and the second measuring pickup are configured such that the first measuring transducer at least partially covers the at least two detection coils of the first measuring pickup with an outer edge region and the second measuring transducer at least partially covers the at least two detection coils of the second measuring pickup with an outer edge region.

7. The sensor arrangement as claimed in claim 1, further comprising:
a reference coil arranged on the common circuit carrier away from the first angle sensor and the second angle sensor such that an inductance of the reference coil is independent of rotational movement of the rotating component.

8. The sensor arrangement as claimed in claim 7, further comprising:
an evaluation and control unit configured to (i) determine the first angle information item based on the inductance of the reference coil and a periodic change in the inductance of the at least two detection coils of the first measuring pickup, (ii) determine the second angle information item based on the inductance of the reference coil and a periodic change in the inductance of the at least two detection coils of the second measuring pickup, and (iii) determine a rotation angle of the rotating component based on the first angle information item and the second angle information item.

9. A sensor arrangement for detecting rotational angles on a rotating component in a vehicle, comprising:
a common circuit carrier;
a first angle sensor including (i) a first measuring transducer coupled to the rotating component and having at least one detection range and (ii) a first measuring pickup arranged on the common circuit carrier and having at least one detection coil, an inductance of the at least one detection coil of the first measuring pickup being influenced by a position of the at least one detection range of the first measuring transducer, the first angle sensor configured to generate a first angle information item that is dependent on rotational movement of the rotating component;
a second angle sensor including (i) a second measuring transducer coupled to the first measuring transducer and having at least one detection range, and (ii) a second measuring pickup arranged on the common circuit carrier and having at least one detection coil, an inductance of the at least one detection coil of the second measuring pickup being influenced by a position of the at least one detection range of the second measuring transducer, the second angle sensor configured to generate a second angle information item that is dependent on the rotational movement of the rotating component;
a reference coil arranged on the common circuit carrier away from the first angle sensor and the second angle sensor such that an inductance of the reference coil is independent of rotational movement of the rotating component; and
an evaluation and control unit configured to (i) determine the first angle information item based on the inductance of the reference coil and a periodic change in the inductance of the at least one detection coil of the first measuring pickup, (ii) determine the second angle information item based on the inductance of the reference coil and a periodic change in the inductance of the at least one detection coil of the second measuring pickup, and (iii) determine a rotation angle of the rotating component based on the first angle information item and the second angle information item.

10. The sensor arrangement as claimed in claim 9, wherein:
the first measuring transducer and the second measuring transducer are respectively configured as an annular disk driven by the rotating component, and
the at least one detection range of the first measuring transducer and the at least one detection range of the second measuring transducer are arranged as an annular segment on an outer edge region of the respective annular disk and include the electrically conductive material.

11. The sensor arrangement as claimed in claim 10, wherein the first measuring transducer has four detection ranges and, on an outer circumference, a first annular gear with a first number of teeth, and is fitted onto the rotating component and connected thereto in a rotationally fixed manner.

12. The sensor arrangement as claimed in claim 11, wherein:
the second measuring transducer has two detection ranges and, on an outer circumference, a second annular gear which has a second number of teeth and meshes with the first annular gear of the first measuring transducer, and
the first number of teeth and the second number of teeth have a predetermined tooth ratio.

13. The sensor arrangement as claimed in claim 9, wherein the at least one detection coil of the first measuring pickup and the at least one detection coil of the second measuring pickup are arranged in the form of annular segments in the common circuit carrier.

14. The sensor arrangement as claimed in claim 12, wherein:
the first measuring pickup has three detection coils and generates the first angle information item with a first periodicity,
the second measuring pickup has three detection coils and generates the second angle information item with a second periodicity,
a periodicity ratio of the first periodicity to the second periodicity is the inverse of the tooth ratio of the first number of teeth to the second number of teeth.

15. The sensor arrangement as claimed in claim 9, wherein the at least one detection coil of the first measuring pickup and the at least one detection coil of the second measuring pickup are distributed in the common circuit carrier in a plurality of layers.

16. The sensor arrangement as claimed in claim 9, wherein the common circuit carrier, the first measuring pickup, and the second measuring pickup are configured such that the first measuring transducer at least partially covers the at least one detection coil of the first measuring pickup with an outer edge region and the second measuring transducer at least partially covers the at least one detection coil of the second measuring pickup with an outer edge region.

\* \* \* \* \*

UNITED STATES PATENT AND TRADEMARK OFFICE
CERTIFICATE OF CORRECTION

PATENT NO. : 10,330,496 B2
APPLICATION NO. : 15/039055
DATED : June 25, 2019
INVENTOR(S) : Volker Frese Page 1 of 1

It is certified that error appears in the above-identified patent and that said Letters Patent is hereby corrected as shown below:

In the Claims

In Column 8, Lines 6-7, Lines 13-14 of Claim 1 should read:
measuring transducer such that the inductance of the at
least two detection coils of the first measuring pickup In Column 8, Lines 55-56, Lines 1-2 of Claim 3 should read:
3. The sensor arrangement as claimed in claim 1, wherein:
the second measuring transducer has two detection ranges Signed and Sealed this
Tenth Day of September, 2019

Andrei Iancu
*Director of the United States Patent and Trademark Office*